United States Patent [19]
Peng

[11] Patent Number: 5,840,447
[45] Date of Patent: Nov. 24, 1998

[54] MULTI-PHASE PHOTO MASK USING SUB-WAVELENGTH STRUCTURES

[75] Inventor: Song Peng, So. Burlington, Vt.

[73] Assignee: International Business Machines Corporation, Armonk, N.Y.

[21] Appl. No.: 920,688

[22] Filed: Aug. 29, 1997

[51] Int. Cl.[6] .................................................. G03F 9/00
[52] U.S. Cl. .................................................. 430/5
[58] Field of Search ........................... 430/5, 322, 324

[56] References Cited

U.S. PATENT DOCUMENTS

| | | | |
|---|---|---|---|
| 4,762,396 | 8/1988 | Dumant et al. | 350/320 |
| 5,246,800 | 9/1993 | Muray | 430/5 |
| 5,324,600 | 6/1994 | Jinbo et al. | 430/5 |
| 5,328,807 | 7/1994 | Tanaka et al. | 430/311 |
| 5,356,738 | 10/1994 | Inoue et al. | 430/5 |
| 5,370,975 | 12/1994 | Nakatani | 430/325 |
| 5,411,823 | 5/1995 | Okamoto | 430/5 |
| 5,585,968 | 12/1996 | Guhman et al. | 359/654 |

Primary Examiner—S. Rosasco
Attorney, Agent, or Firm—Scully, Scott, Murphy & Presser; Howard J. Walter, Jr.

[57] ABSTRACT

A phase shift mask using sub-wavelength structures for use in lithography wherein a layer of a first transmissive material being of a first phase is provided. A layer of a second transmissive material being of a second phase is also provided. Disposed in the transition between the first and second regions is a plurality of subwave-length periodic structures. The structures have a first and second side. The structures are shaped such that the effective refractive index along the first sides approximates the refractive index of the first transmissive material and the effective refractive index along the second sides approximates that of the second transmissive material. This arrangement results in a gradual change in the effective refractive index from that of the first transmissive material along the first sides to that of the second transmissive material along the second sides. This gradual change in effective refractive index further results in a gradual phase change from the first phase at the first sides to the second phase at the second sides thereby substantially eliminating the intensity nulls associated with the phase change transition.

16 Claims, 8 Drawing Sheets

MULTI-PHASE PHOTO MASK USING SUB-WAVELENGTH STRUCTURES

BACKGROUND OF THE INVENTION

1. Field of the Invention

This invention relates to phase shift masks as used in photolithography for fabrication of integrated circuits. More specifically, this invention relates to a method for forming transition regions between adjacent phase shift mask regions which are of different phase to eliminate intensity nulls caused by the phase shift masks.

2. Description of the Related Art

In the manufacturing of integrated circuits, photolithography is used for reproducing the image of a pattern drawn on a mask. This image is formed on a thin layer of photo resist, itself deposited onto a layer of a product to be specifically etched, for example, a wafer of silicon dioxide. After having been exposed, irradiated areas of the resist are dissolved by a suitable developing material, in the case of a positive resist. Conversely, the non-irradiated areas are dissolved in the case of a negative resist.

As semiconductor devices are highly integrated, a photolithographic technique for forming a fine resist pattern with high precision has been vigorously studied. FIG. 1 is a view showing a reducing projection exposure apparatus which is generally used for such pattern formation.

In the exposure apparatus, a wafer 15, on which a resist having a predetermined thickness is disposed, is put on a wafer stage 14. Light from a light source 11 passes through a photo mask on which a predetermined mask pattern is formed, that is, a reticle 12. The light is then projected onto the resist on the wafer 15 through a reducing projection lens 13. In addition, $\theta_1$ designates an angle formed by connecting an intersecting point of the optical axis and the wafer to the radius of the exit pupil of the projection lens.

In general, the limit of resolution (R) of the reducing projection exposure apparatus is represented by the numerical aperture ($NA = \sin\theta_1$) of the projection lens and the wavelength ($\gamma$) of light as shown in the following equation (1), where $k_1$ is a constant indicating resist performance.

$$R = k_1 \gamma / NA \qquad (1)$$

In addition, when the resist pattern is actually formed, the depth of focus (DOF) shown in the following equation (2) is necessary for a curve or a step difference of the substrate. The DOF is generally set to 1.5 microns or more. In the equation (2), $k_2$ is a constant.

$$DOF = k_2 \gamma / (NA)^2 \qquad (2)$$

Meanwhile, it is thought that $\gamma$ may be decreased or NA may be increased according to equation (1) in order to form a fine exposure pattern by the reducing projection exposure apparatus. However, when $\gamma$ is decreased, it becomes very difficult to make a lens and when NA is increased, the DOF is reduced. Thus, there is a limit in forming the fine resist pattern in the exposure apparatus in the resist material and it is difficult to actually form a pattern of at least the same resolution as the wavelength.

Methods for forming a resist pattern using a phase shift mask have been developed as methods for forming fine resist patterns that are not restricted by the resist material and the exposure apparatus.

Phase shifting mask technology for optical lithography is well known. If a light from a coherent or partially coherent source is divided by a mask into two or more beams that are superimposed, the intensity in the region of super position varies from point to point between maxima, which exceed the sum of the intensities in the beam, and minima, which may be zero. This phenomenon is called interference. Phase shifting can influence the location and intensity of the interference maxima and minima by adjustment of pattern design and deliberate phase change of the light beams. This results in imaging of higher spatial frequency objects, enhancement of edge contrast, larger exposure latitude, and/or improved depth of focus.

Phase shifting is typically accomplished by introducing an extra patterned layer (or layers) of transmissive material on the mask. It is alternatively implemented by etching the mask substrate to various thicknesses so as to effectively provide at least one extra layer. As light propagates through the substrate and through the extra layer, the wave length of the light is reduced from that in the ambient air by the refractive indices of the substrate and the extra layer, respectively.

The optical path difference (OPD) between the two beams through the extra material layer and without it, is given by the following equation (3) Where n is the refractive index of the extra layer and a is the thickness of the extra layer.

$$OPD = (n-1)a \qquad (3)$$

The phase difference is then proportional to the optical path difference divided by the wave length (in vacuum) of the transmitted light. Usually a phase shift of 180° is desirable (i.e., one-half the wave length). The added layer is usually considered to be the phase shifter.

Thus, phase shifting is implemented so that the waves transmitted through two adjacent apertures in a photolithography mask are 180° out of phase with one another, whereby destructive interference minimizes the intensity between the images formed by the two apertures. Any optical system will project the images of such a phase shifting transmission object with better resolution and higher contrast than a corresponding transmission object without the phase shifts. This improvement in resolution and contrast is highly advantageous in fine line optical lithography, as is typical of fabrication of integrated circuits.

FIGS. 2(a) and 2(b) are views showing the structure and a principle of a phase shift mask, in which FIG. 2(a) is a sectional schematic view showing the structure of the phase mask 10. FIG. 2(b) is a graph showing a light intensity distribution on a surface perpendicular to an optical axis of a lens in which coherent light is partially applied to the phase shift mask shown in FIG. 2(a) and where the diffracted light is focused by the lens. Referring to these figures, reference numeral 10 designates a phase shift mask which comprises a quartz substrate 2 and a phase shifter 1. In addition, in FIG. 2(b), the point at which the light intensity is nearly zero, shown as point 4, corresponds to an edge 3 of the shifter 1.

The phase shift mask 10 is used as a reticle. When light from a light source 11 is applied to a wafer 15 on which a resist is applied by the reducing projection exposure apparatus shown in FIG. 1, the light from the light source 11 is diffracted by the edge 3 of the phase shifter 1. Thus, a region in which the light intensity is lowered is formed just under the edge 3 of the phase shifter 1. The transmitted light having the light intensity distribution shown in FIG. 2(b) is then applied to the wafer 15 on which the resist is present. The resist on the wafer 15 is then subjected to pattern exposure and normal developing processing.

As a result, a fine resist pattern having a precision which is one-half of the wavelength of the light can be formed. In addition, when a negative type resist is used as the resist on the wafer 15, an opening pattern is formed just under the edge 3 of the phase shift mask 10. Alternatively, when a positive type resist is used, the resist just under the edge 3 of the phase shift mask 10 is left on the wafer 15 and a resist pattern in the form of a line is formed on the wafer 15.

One problem encountered with the use of phase shift masks occurs when two adjacent regions of the mask which abut one another are of different phases. For instance, as shown in top view in FIG. 3(a), a mask includes region A of phase 0° and region B of phase 180°, where regions A and B are intended to print on a wafer two adjacent structures which together define a single feature, such as a semiconductor region. The areas 16,18 on either side of regions A and B are the unexposed opaque portions of the mask which are covered with a material such as chrome.

The mask shown in FIG. 3(a) (as is understood from optics) forms an intensity null in the image formed on the wafer at the junction between regions A and B as shown in FIG. 3(b). This undesirable intensity null 20 is shown in the inverted areal image intensity (dotted lines) in FIG. 3(b) where instead of the feature line defined by regions A and B being a straight clearly defined line there is instead bridging, i.e., unexposed portions (dotted line) 20 at the transition region. In a typical application this means that a semiconductor region defined by regions A and B might include a highly undesirable discontinuity.

A simple solution to this problem is to use a trim mask and a second exposure which exposes the unexposed portions. This solution attempts to equalize the total dose applied to the resist. However, this extra procedure greatly increases the cost and complexity of the masking process.

A number of other techniques have been proposed to solve this problem. One solution uses intermediate regions between the 0° and 180° phase shifts. It is to be understood that in the phase shifting mask context, typically a 0° phase means that there is no phase shifter layer present over that region. A 180° phase indicates that there is a full thickness of transparent material (phase shifter layer) over that region of the mask.

Intermediate regions would have some fraction of the full thickness, for example, a 90° phase shifting layer would be half the thickness of the 180° phase shifting layer. While this technique improves the resolution due to the intensity null, often several phase shift transition layers are needed to get satisfactory results. Even with several phase shifting layers, as shown in FIG. 4(a) the resulting intensity distribution is still less than optimum, as shown in FIG. 4(b). FIG. 4(a) shows phase shifting layers 22, 24, 26, and 28 which are 0°,60°,120°,and 180° out of phase, respectively. As can be seen clearly in FIG. 4(b), the intensity nulls 30, 32, and 34 associated with the transitions between phase shifting layers 22, 24, 26, and 28 have not been completely eliminated.

Additionally, this technique substantially increases the cost and complexity of mask making because multiple etch processes are necessary to create the varying thickness phase shifting layers.

Another technique which attempts to solve this problem uses a ramped region which ramps from the 0° phase thickness (typically this is zero) to the 180° phase thickness (typically the full thickness). This technique also has less than optimum results. Because the ramp region is very difficult to fabricate and because the angle of the ramp is critical, the cost and complexity of mask fabrication is significantly increased.

Still another technique, disclosed in U.S. Pat. No. 5,246,800 to Muray, uses a discrete tooth profile for the transition between 0° and 180° phase shifting layers. While this technique has its advantages, it is based upon sub-resolution structures which will not operate in the sub-wavelength region.

The transition structures between phase shifting layers are of a sub-resolution size, where the pitch ($\Omega$) between teeth is calculated from the following equation (4) where $\lambda$ is the wavelength of light and NA is the numerical aperture.

$$\Omega = 2\lambda/5NA \qquad (4)$$

Additionally, at least three physical thickness phase shifting layers are needed, two level structures will not work. Therefore, like the previous technique, a multiple etch process is necessary.

SUMMARY OF THE INVENTION

Therefore, it is an object of the present invention to provide a phase shifting transition which eliminates the intensity nulls caused by phase shifting layers on phase shift masks.

It is another object of the present invention to provide sub-wavelength structures on photo masks to eliminate the intensity nulls caused by phase shifting layers on phase shift masks.

It is yet another object of the present invention to provide a technique to eliminate the intensity nulls caused by phase shifting layers on phase shift masks which eliminates the need for multiple etch processes.

It is yet another object of the present invention to provide a technique to eliminate the intensity nulls caused by phase shifting layers on phase shift masks which eliminates the need for multiple exposure processes.

It is still yet another object of the present invention to provide a low cost and complexity technique for eliminating the intensity nulls caused by phase shifting layers on phase shift masks.

Accordingly, a phase shift mask using sub-wavelength structures for use in lithography is disclosed wherein the solution to the intensity null problem is based upon the effective medium theory of sub-wavelength periodic structures. A layer of a first transmissive material comprising a first region, being of a first phase, and having a first refractive index is provided. A layer of a second transmissive material is also provided. The layer of second transmissive material comprising a second region, being of a second phase, and having a second refractive index.

Disposed in the transition between the first and second regions is a plurality of periodic structures of the first transmissive material. The pitch between the structures being less than the wavelength of the light used in the lithography process. The structures have a first and second side, the first side being proximate to the first region, and the second side being proximate to the second region.

The structures are shaped such that the effective refractive index along the first sides approximates the refractive index of the first transmissive material and the effective refractive index along the second sides approximates that of the second transmissive material. This arrangement results in a gradual change in the effective refractive index from that of the first transmissive material along the first sides to that of the second transmissive material along the second sides. This gradual change in effective refractive index further results in a gradual phase change from the first phase at the first sides to the second phase at the second sides thereby substantially eliminating the intensity nulls associated with the phase change transition.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE PREFERRED EMBODIMENTS

Figure 5A:
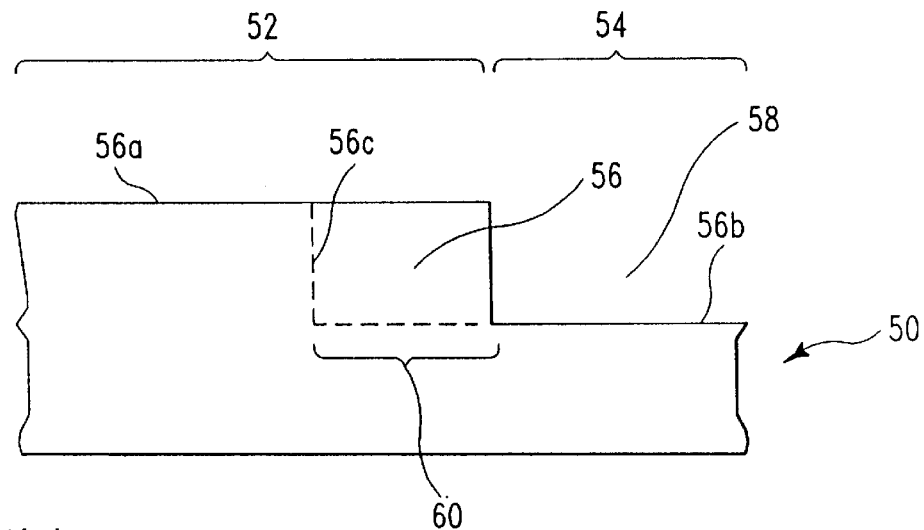
FIG. 5(a) illustrates a side view of a first embodiment of a phase shifting mask of the present invention.

FIG. 5(a) shows a side view of a portion of a phase shift mask 50 in accordance with a first embodiment of the present invention. The phase shift mask 50 typically comprises first and second regions 52,54. The first and second regions 52,54 comprising first and second transmissive materials 56,58, preferably quartz and air, respectively. The first and second transmissive materials 56,58 have first and second refractive indices, respectively.

The first transmissive material 56 further has a first surface 56a, and a second surface 56b, the first surface 56a being in the first region 52, the second surface 56b being in the second region 54. A stepped portion 56c is provided at a transition 60 between the first surface 56a and the second surface 56b whereby the first surface 56a is elevated over the second surface 56b such that the first transmissive material 56 at the first surface 56a results in a first phase and the first transmissive material 56 at the second surface 56b results in a second phase. The first phase is preferably 180°, the second phase is preferably 0°, as shown in FIG. 5(c) at points 76 and 78.

Alternatively, the second transmissive material 58 can be a glass, polymer, or any material which transmits light, and is disposed in the second region 54. In this arrangement the layer of second transmissive material 58 would result in a second phase change other than 0°.

Figure 5B:
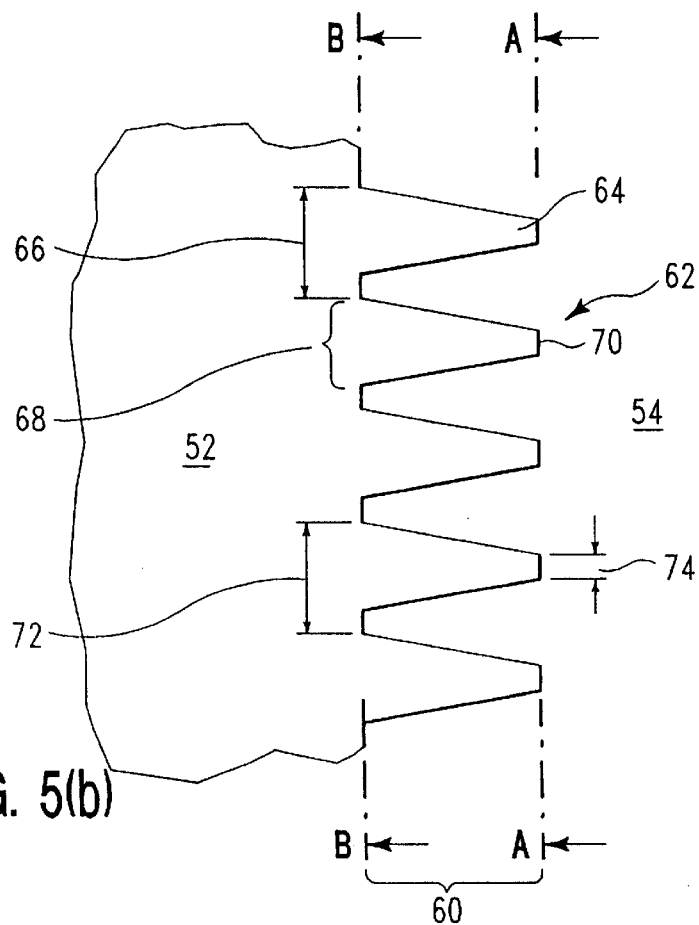
FIG. 5(b) illustrates a top view of the phase shifting mask of FIG. 5(a)
Figure 5C:
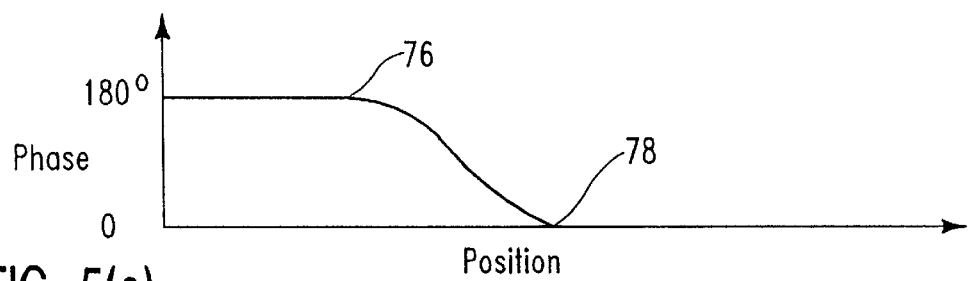
FIG. 5(c) illustrates the phase profile for the phase shifting mask of FIG. 5(a)

FIG. 5(b) shows a top view of a portion of the phase shifting mask 50 as shown in FIG. 5(a) illustrating a plurality of periodic structures 62 disposed in the transition 60. The individual structures that make up the periodic structure 62 comprise projections 64 fabricated of the first transmissive material 56. Each projection 64 has a first side 68 of a first width 72 integral with the first transmissive material 56, from which tapered sides lead to a second side 70, of a second width 74 which is smaller than the first width 72. Preferably, the second width 74 is approximately one half the first width 72.

Figure 5D:
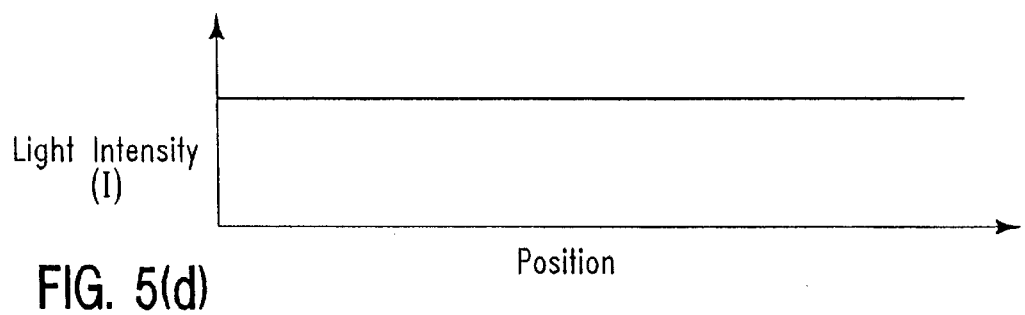
FIG. 5(d) illustrates the intensity distribution resulting from the phase shifting mask of FIG. 5(a)
Figure 5E:
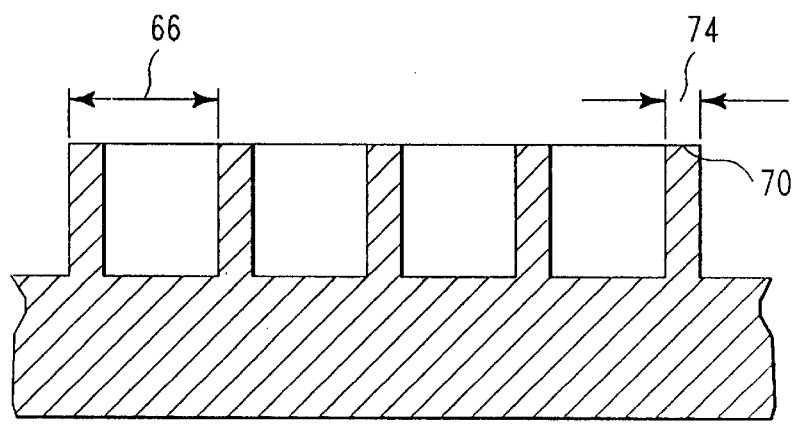
FIG. 5(e) illustrates a sectional view taken along line A—A in FIG. 5(a)

The first side 68 being proximate to the first region 52, the second side being proximate to the second region 54. The arrangement of the protrusions 62 results in alternating regions of first and second transmissive materials 56,58 along the first sides (shown as line A—A) as can be seen in FIG. 5(e). Likewise, alternating regions of first and second transmissive materials 56,58 are present along the second sides (shown as line B—B) as can be seen in FIG. 5(f).

In the present invention, unlike the transition structures of the prior art, the structures are sized in the sub-wavelength region where the pitch ($\Omega$) 66 between projections 64 is calculated from the following equation (5) where n is the refractive index of the first transmissive material (preferably quartz).

$$\Omega = \lambda/2n \tag{5}$$

Figure 5F:
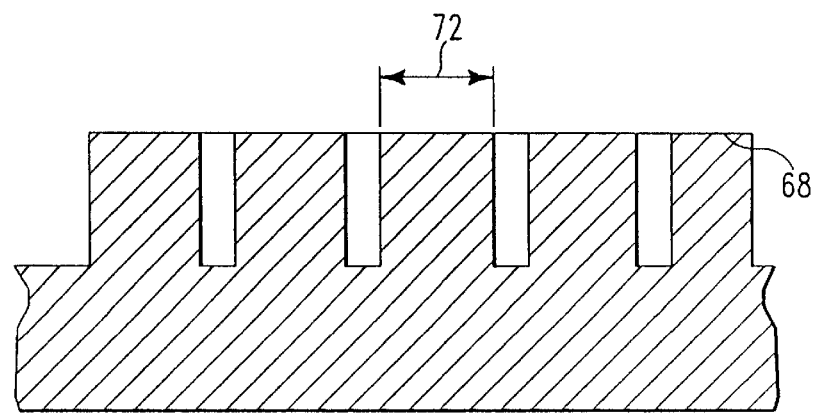
FIG. 5(f) illustrates a sectional view taken along line B—B in FIG. 5(a)

As shown in FIGS. 5(e) and 5(f) the regions between lines A—A and B—B contain a periodic structure of first and second transmissive materials 56,58 (preferably, quartz and air). Each of these periodic structures has an effective refractive index ($n_{eff}$) given by the following equation (6) where $n_{air}$ is the refractive index for air which is equal to 1, and f is the duty cycle of the periodic structure.

$$n_{eff} = (n^2 f + n_{air}^2 (1-f))^{1/2} \tag{6}$$

The duty cycle (f) is merely the ratio of the width 72 of the first transmissive material 56 at the point where the effective refractive index is to be calculated (in this case at A—A) to the pitch 66.

Figure 1:
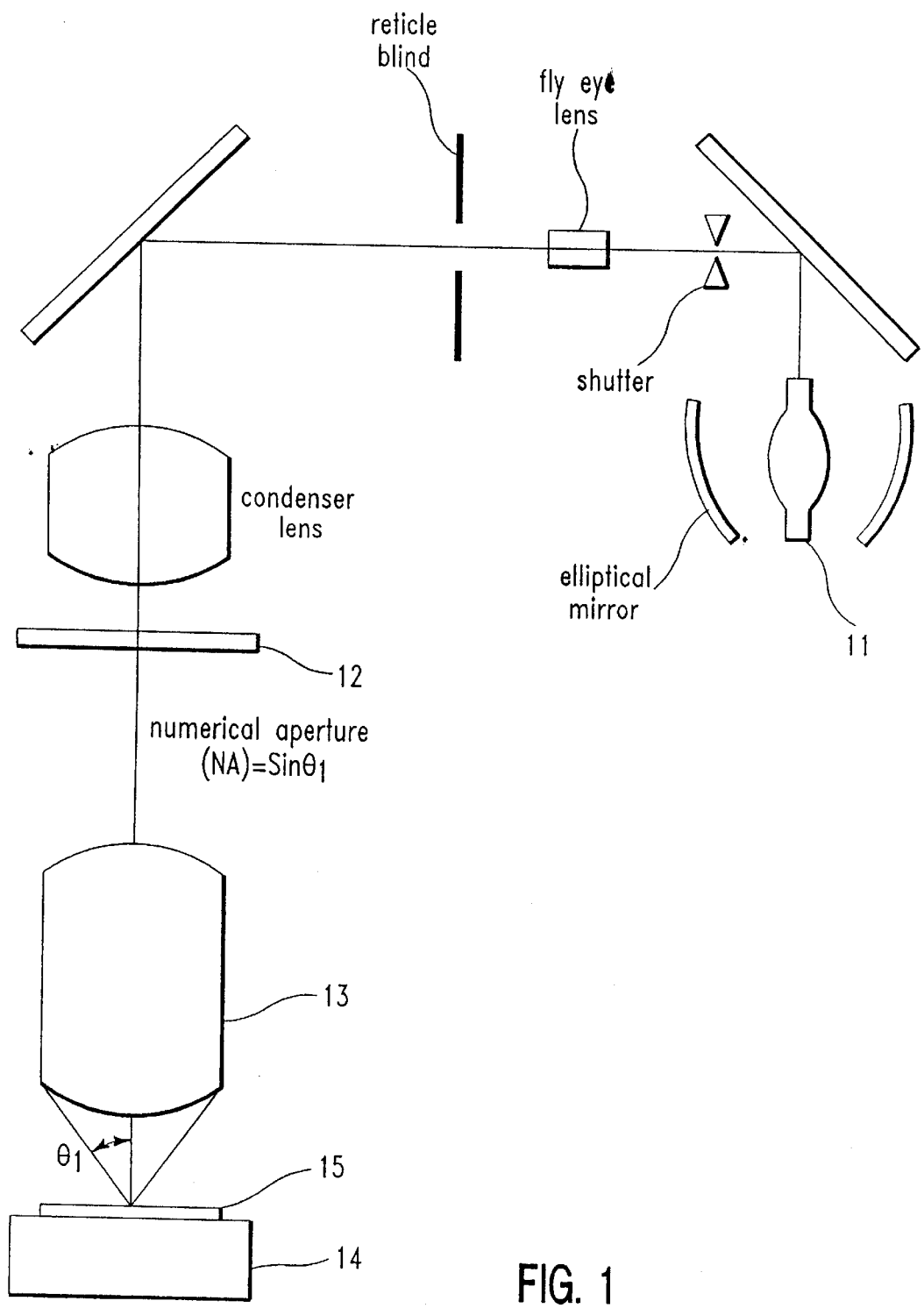
FIG. 1 illustrates a structure of a reducing projection exposure apparatus.
Figure 2A:
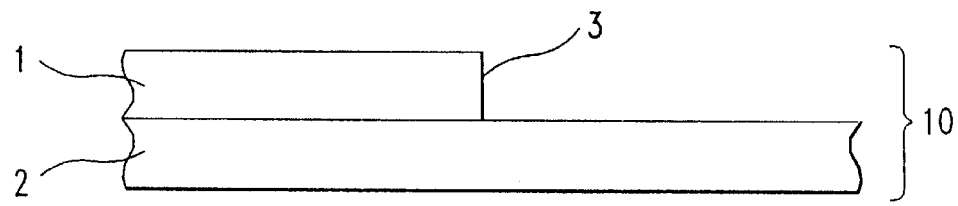
FIGS. 2(a) and 2(b) illustrate the structure of a phase shift mask and the resulting intensity distribution.
Figure 2B:
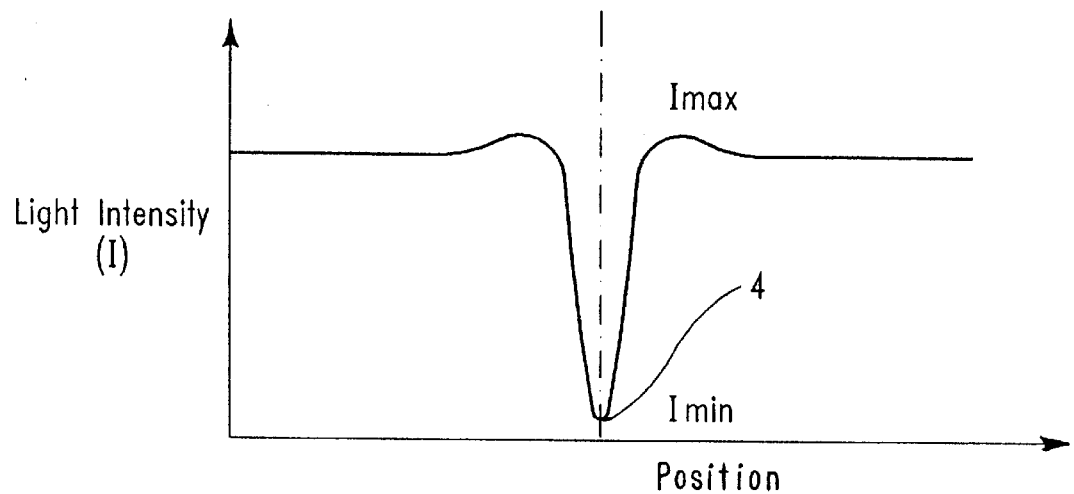
Figure 3B:
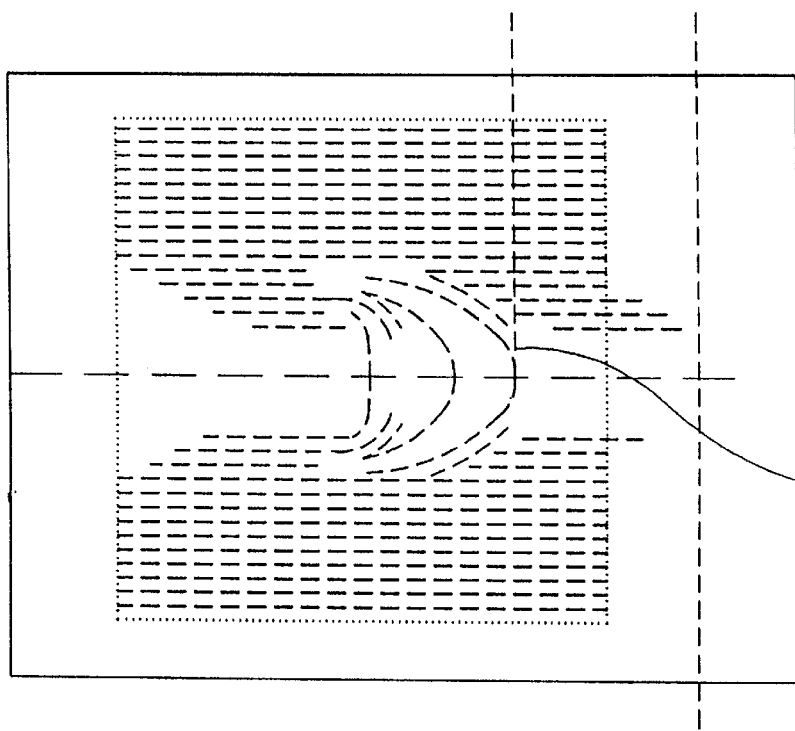
FIGS. 3(a) and 3(b) illustrate a prior art phase shifting mask and the resulting wafer image.
Figure 3A:
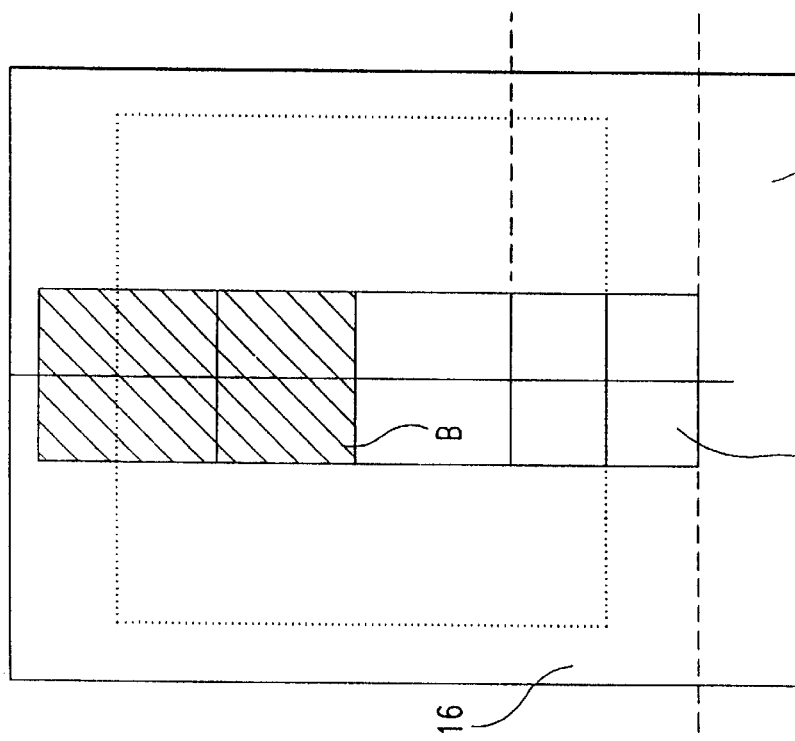
Figure 4A:
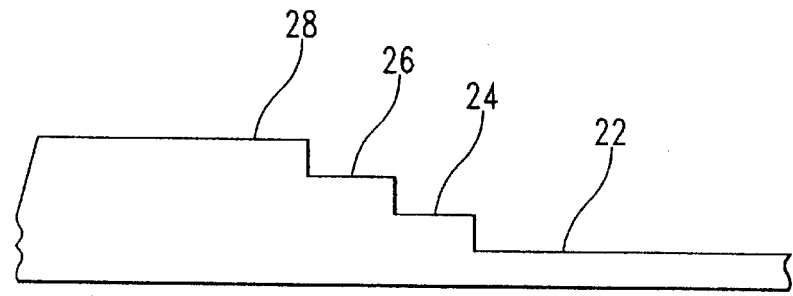
FIGS. 4(a) and 4(b) illustrate a multiple layer phase shifting mask of the prior art and the resulting intensity distribution.
Figure 4B:
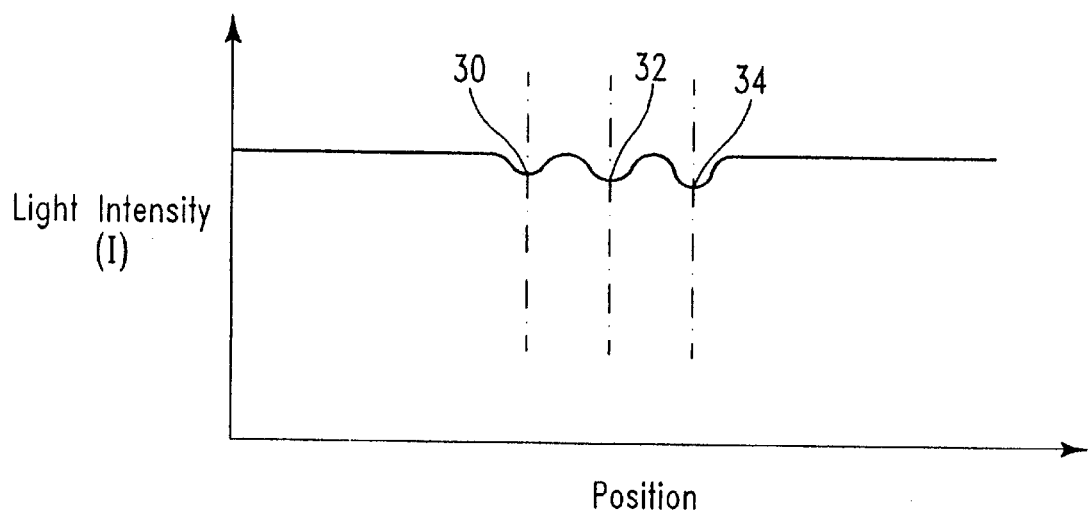

The effective refractive index along line A—A is close to that of air because the duty cycle along A—A is small. The refractive index along line B—B is close to that of quartz because of the high duty cycle along line B—B. Therefore, from A—A to B—B the effective refractive index changes gradually from the refractive index of air to that of quartz. Consequently, the phase change, as shown in FIG. 5(c) also changes gradually from 180° at point 76 to 0° at point 78. The resulting intensity distribution on the wafer is shown in FIG. 5(d) whereby it can be seen by a comparison with FIG. 2(b), that the intensity nulls typically associated with phase shifting layers have been eliminated.

Figure 6A:
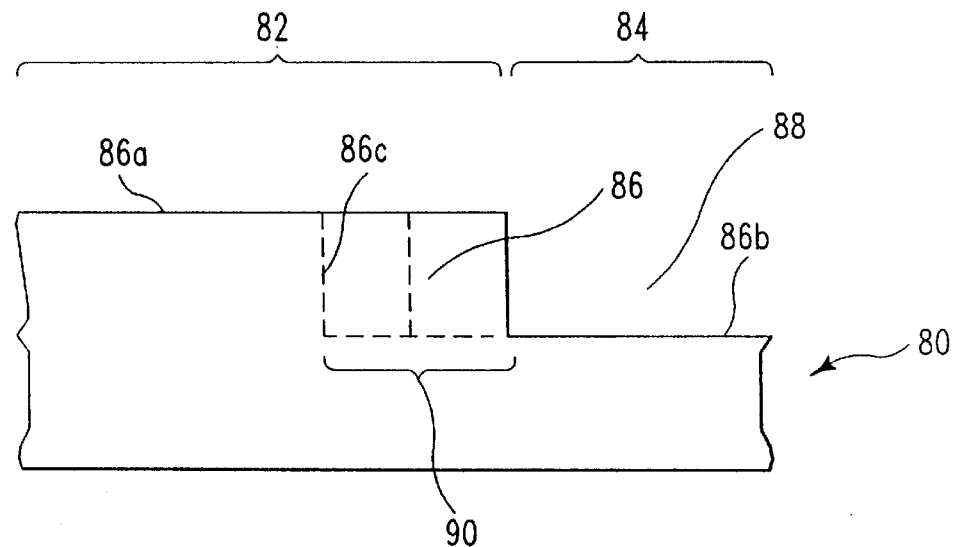
FIG. 6(a) illustrates a side view of a second embodiment of a phase shifting mask of the present invention.

FIG. 6(a) shows in simulation a side view of a portion of a phase shifting mask 80 in accordance with a second embodiment of the present invention. The phase shifting mask 80 typically comprises first and second regions 82,84. The first and second regions 82,84 comprise first and second transmissive materials 86,88, preferably quartz and air, respectively. The first and second transmissive materials 86,88 have first and second refractive indices, respectively.

The first transmissive material 86 further has a first surface 86a, and a second surface 86b, the first surface 86a being in the first region 82, the second surface 86b being in the second region 84. A stepped portion 86c is provided at a transition 90 between the first surface 86a and the second surface 86b whereby the first surface 86a is elevated over the second surface 86b such that the first transmissive material 86 at the first surface 86a results in a first phase and the first transmissive material 86 at the second surface 86b results in a second phase. The first phase is preferably 180°, the second phase is preferably 0°, as shown in FIG. 6(c) at points 108 and 114.

Alternatively, the second transmissive material 88 can be a glass, polymer, or any material which transmits light, and is disposed in the second region 84. In this arrangement the layer of second transmissive material 88 would result in a second phase change other than 0°.

Figure 6B:
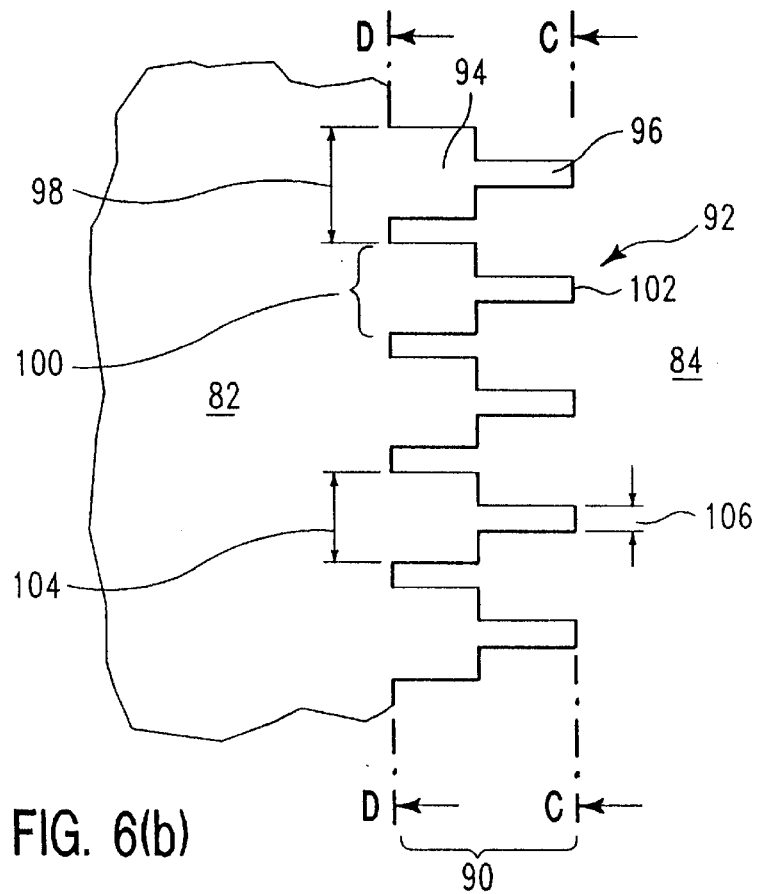
FIG. 6(b) illustrates a top view of the phase shifting mask of FIG. 6(a)
Figure 6C:
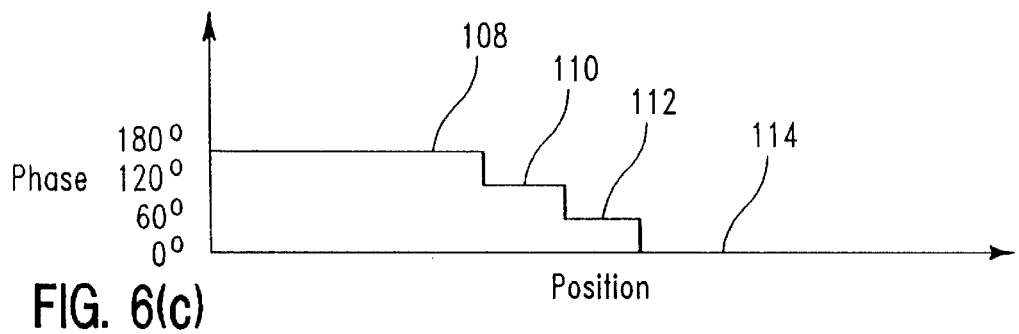
FIG. 6(c) illustrates the phase profile for the phase shifting mask of FIG. 6(a)
Figure 6D:
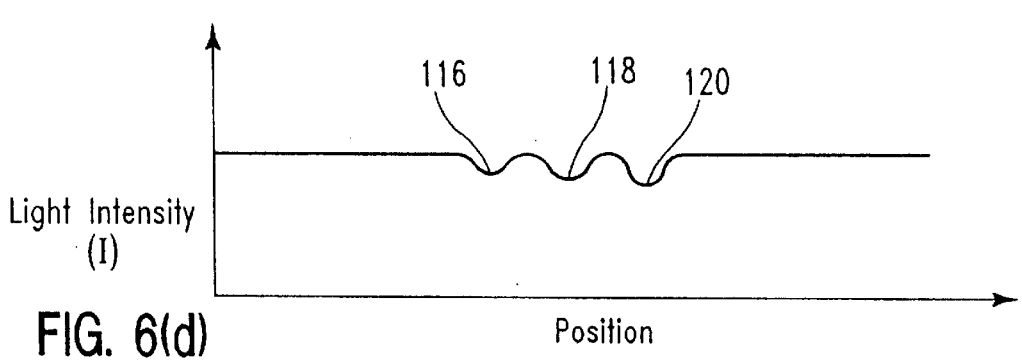
FIG. 6(d) illustrates the intensity distribution resulting from the phase shifting mask of FIG. 6(a)
Figure 6E:
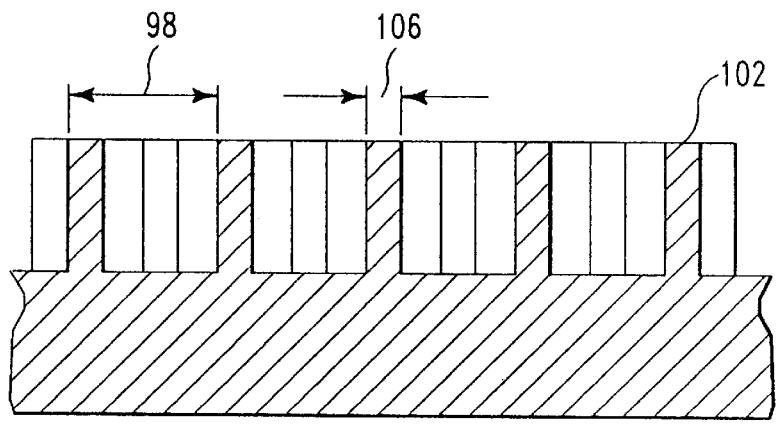
FIG. 6(e) illustrates a sectional view taken along line C—C in FIG. 6(a)

FIG. 6(b) shows in simulation a top view of a portion of the phase shifting mask 80 as shown in FIG. 6(a) illustrating a plurality of periodic structures 92 disposed in the transition 90. The individual structures that make up the periodic structure 92 comprises first and second rectangular projections 94,96 fabricated from the first transmissive material 86. The first rectangular projection 94 has a first side 100 of a first width 104 integral with the first transmissive material 86. The second rectangular projection 96 has a second side 102 of a second width 106 which is smaller than the first width 104. Preferably the second width 106 is approximately one half the width of the first width 104. The second rectangular projection 96 being integral with the first rectangular projection 94. The first side 100 being proximate to the first region 82, the second side 102 being proximate to the second region 84. The arrangement of the protrusions 92 results in alternating layers of first and second transmissive materials 86,88 along the first sides (shown as line C—C) as can be seen in FIG. 6(e). Likewise, alternating regions of first and second transmissive materials 86,88 are present along the second sides (shown as line D—D) as can be seen in FIG. 6(f).

Figure 6F:
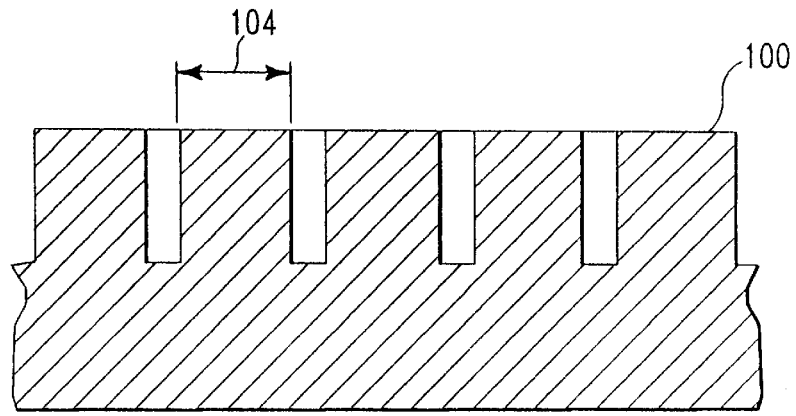
FIG. 6(f) illustrates a sectional view taken along line D—D in FIG. 6(a).

As shown in FIGS. 6(e) and 6(f) the regions between lines C—C and D—D contain a periodic structure of first and second transmissive materials 86,88 (preferably quartz and air, respectively). Each of these periodic structures has an effective refractive index ($n_{eff}$) given by equation (6). Like the first embodiment previously discussed, the effective refractive index along line C—C is close to that of the second transmissive material 88 because the duty cycle of the first transmissive material 86 along line C—C is small. The refractive index along line D—D is close to that of the first transmissive material 86 because of the high duty cycle along line C—C. Therefore, from C—C to D—D the effective refractive index changes gradually from the refractive index of the second transmissive material 88 to that of the first transmissive material 86. Consequently, the phase change, as shown in FIG. 6(c) also changes gradually from the first phase (preferably 180°) at point 108 to intermediate phases at points 110 and 112, and finally to the second phase (preferably 0°) at point 114. The resulting intensity distribution on the wafer is shown in FIG. 6(d) whereby it can be seen that the intensity null typically associated with phase shifting layers has been virtually eliminated. Slight intensity nulls are present at points 116, 118, and 120 corresponding to phase changes 110,112, and 114 respectively. However, these intensity nulls represent a significant improvement over that achieved in the prior art with a single height phase shifting layer.

From the foregoing, it becomes readily apparent to one skilled in the art that the novel phase shifting mask of the present invention offers increased efficiency over currently employed phase shifting masks. Due to the inventive structure, the advantages offered by the inventive phase shifting mask in which sub-wavelength periodic structures are used resides in:

(a) the elimination of the undesirable intensity nulls caused by the transitions between phase shifting layers on a phase shifting mask;

(b) the elimination of more than two physical thicknesses (layers) thereby eliminating the need for more than one etching process;

(c) the elimination of multiple exposure processes to eliminate the intensity nulls associated with the transitions between phase shifting layers; and (d) the reduction in the cost and complexity of fabricating phase shifting masks due to the elimination of multiple layers and/or the multiple exposure methods of the prior art.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

I claim:

1. A phase shift mask for lithography in which light passes through, thereby imparting a pattern onto an integrated circuit, the light having a wavelength and an intensity, the phase shift mask defining a phase change transition between a first and second region of respectively two different first and second phases, the phase shift mask comprising:

a layer of a first transmissive material comprising the first region and of the first phase, the first transmissive material having a first refractive index;

a layer of a second transmissive material comprising the second region and of the second phase, the second transmissive material having a second refractive index;

a plurality of periodic structures of the first transmissive material disposed in the transition between the first and second regions, the pitch between structures being less than the wavelength of the light used in the lithography process, the structures having a first side proximate to the first region and a second side proximate to the second region, the structures being shaped such that the effective refractive index along the first sides approximates the refractive index of the first transmissive material and the effective refractive index along the second sides approximates that of the second transmissive material, the transition having a gradual change in effective refractive index from that of the first transmissive material along the first sides to that of the second transmissive material along the second sides, resulting in a gradual phase change from the first phase at the first sides to the second phase at the second sides, thereby substantially eliminating intensity nulls associated with phase change transitions.

2. The phase shift mask of claim 1, wherein the first transmissive material is quartz and the second transmissive material is air.

3. The phase shift mask of claim 1, wherein the first phase is 180° and the second phase is 0°.

4. The phase shift mask of claim 1, wherein the pitch between structures is given by the equation;

$$\Omega = \lambda/2n$$

where Ω is the pitch, λ is the wavelength of light and n is the refractive index of the first transmissive material.

5. The phase shift mask of claim 1, wherein the structures comprise a projection which tapers from a first width at the first side to a smaller second width at the second side.

6. The phase shift mask of claim 5, wherein the second width is approximately one half the first width.

7. The phase shift mask of claim 1, wherein the structures comprise first and second rectangular projections, the first rectangular projection having a first width at the first side, the second rectangular projection being disposed on the first rectangular projection and having a second width at the second side smaller than the first width of the first rectangular projection.

8. The phase shift mask of claim 7, wherein the second width is approximately one half the first width.

9. The phase shift mask of claim 7, wherein the structures comprise first and second rectangular projections, the first rectangular projection having a first width at the first side, the second rectangular projection being disposed on the first rectangular projection and having a second width at the second side smaller than the first width of the first rectangular projection.

10. The phase shift mask of claim 9, wherein the second width is approximately one half the first width.

11. A phase shift mask for lithography in which light passes through, thereby imparting a pattern of light onto an integrated circuit, the light having a wavelength and an intensity, the phase shift mask defining a phase change transition between a first and second region of respectively two different first and second phases, the phase shift mask comprising:

a layer of transmissive material, the transmissive material having a refractive index, a first surface and a second surface, and a stepped portion providing the transition between the first and second surfaces, the first surface being elevated over the second surface, the region of the first surface comprising the first region and of the first phase, the region of the second surface comprising the second region and of the second phase;

a plurality of periodic structures of the transmissive material disposed in the transition between the first and second regions, the pitch between structures being less than the wavelength of the light used in the lithography process, the structures having a first side proximate to the first region at the stepped portion and a second side proximate to the second region, the structures being shaped such that the effective refractive index along the first sides approximates the refractive index of the transmissive material and the effective refractive index along the second sides approximates that of air, the transition having a gradual change in effective refractive index from that of the transmissive material along the first sides to that of air along the second sides, resulting in a gradual phase change from the first phase at the first sides to the second phase at the second sides thereby substantially eliminating intensity nulls associated with phase change transitions.

12. The phase shift mask of claim 11, wherein the transmissive material is quartz.

13. The phase shift mask of claim 11, wherein the first phase is 180° and the second phase is 0°.

14. The phase shift mask of claim 11, wherein the pitch between structures is given by the equation;

$$\Omega = \lambda/2n$$

where Ω is the pitch, λ is the wavelength of light and n is the refractive index of the transmissive material.

15. The phase shift mask of claim 11, wherein the structures comprise a projection which tapers from a first width at the first side to a smaller second width at the second side.

16. The phase shift mask of claim 15, wherein the second width is approximately one half the first width.

* * * * *